US008728927B1

(12) United States Patent
Cheng et al.

(10) Patent No.: US 8,728,927 B1
(45) Date of Patent: May 20, 2014

(54) BORDERLESS CONTACTS FOR SEMICONDUCTOR TRANSISTORS

(71) Applicant: International Business Machines Corporation, Armonk, NY (US)

(72) Inventors: Kangguo Cheng, Schenectady, NY (US); Ali Khakifirooz, Mountain View, CA (US); Alexander Reznicek, Troy, NY (US); Raghavasimhan Sreenivasan, Schenectady, NY (US); Charan V. Surisetty, Clifton Park, NY (US); Thomas N. Adam, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/709,662

(22) Filed: Dec. 10, 2012

(51) Int. Cl.
 *H01L 21/44* (2006.01)
(52) U.S. Cl.
 USPC .................. 438/597; 257/E21.658; 438/586; 438/666
(58) Field of Classification Search
 USPC .................. 257/E21.658; 438/586, 597, 666
 See application file for complete search history.

(56) References Cited

U.S. PATENT DOCUMENTS

| | | | |
|---|---|---|---|
| 5,953,614 A * | 9/1999 | Liu et al. | 438/303 |
| 6,083,828 A * | 7/2000 | Lin et al. | 438/639 |
| 6,159,850 A * | 12/2000 | Lee et al. | 438/665 |
| 6,165,901 A * | 12/2000 | Hsu | 438/652 |
| 6,239,011 B1 * | 5/2001 | Chen et al. | 438/595 |
| 6,306,701 B1 * | 10/2001 | Yeh | 438/231 |
| 6,335,279 B2 * | 1/2002 | Jung et al. | 438/666 |
| 6,399,512 B1 * | 6/2002 | Blosse et al. | 438/723 |
| 6,531,724 B1 | 3/2003 | Furukawa et al. | |
| 6,724,054 B1 * | 4/2004 | Kang et al. | 257/407 |
| 6,734,108 B1 * | 5/2004 | Jin et al. | 438/700 |
| 6,803,318 B1 * | 10/2004 | Qiao et al. | 438/700 |
| 6,903,022 B2 * | 6/2005 | Peng et al. | 438/697 |
| 7,687,804 B2 | 3/2010 | Adam et al. | |
| 7,781,282 B2 | 8/2010 | Yoo et al. | |
| 8,084,311 B1 | 12/2011 | Horak et al. | |
| 8,436,404 B2 * | 5/2013 | Bohr et al. | 257/288 |
| 2001/0053595 A1 * | 12/2001 | Hineman | 438/592 |
| 2002/0163025 A1 * | 11/2002 | Vaartstra et al. | 257/295 |

(Continued)

OTHER PUBLICATIONS

M. Wei et al, "A Scalable Self-Aligned Contact NOR Flash Technology", IEEE Symposium on VLSI Technology, Jun. 12-14, 2007. pp. 226-227.

(Continued)

*Primary Examiner* — Asok K Sarkar
(74) *Attorney, Agent, or Firm* — Kevin B. Anderson; Yuanmin Cai (57) ABSTRACT

Embodiments of the invention include methods of forming borderless contacts for semiconductor transistors. Embodiments may include providing a transistor structure including a gate, a spacer on a sidewall of the gate, a hard cap above the gate, a source/drain region adjacent to the spacer, and an interlevel dielectric layer around the gate, forming a contact hole above the source/drain region, forming a protective layer on portions of the hard cap and of the spacer exposed by the contact hole; deepening the contact hole by etching the interlevel dielectric layer while the spacer and the hard cap are protected by the protective layer, so that at least a portion of the source/drain region is exposed by the deepening of the contact hole; removing the protective layer; and forming a metal contact in the contact hole.

25 Claims, 5 Drawing Sheets

(56) References Cited

U.S. PATENT DOCUMENTS

| | | | |
|---|---|---|---|
| 2004/0082182 A1* | 4/2004 | Blosse et al. | 438/700 |
| 2006/0128157 A1* | 6/2006 | Lee et al. | 438/700 |
| 2006/0148227 A1* | 7/2006 | Kronke et al. | 438/586 |
| 2010/0038715 A1 | 2/2010 | Babich | |
| 2011/0108930 A1 | 5/2011 | Cheng et al. | |
| 2011/0248362 A1 | 10/2011 | Guo et al. | |
| 2011/0298061 A1 | 12/2011 | Siddiqui et al. | |
| 2013/0260548 A1* | 10/2013 | Park, Chang Seo | 438/592 |

OTHER PUBLICATIONS

S.-C. Seo et al, "Full Metal Gate with Borderless Contact for 14 nm and Beyond," Symposium on VLSI Technology (VLSIT), Jun. 14-16, 2011, pp. 36-37.

\* cited by examiner

BORDERLESS CONTACTS FOR SEMICONDUCTOR TRANSISTORS

BACKGROUND

The present invention relates generally the fabrication of semiconductor devices, and more specifically to forming borderless contacts to the semiconductor devices.

Field-effect transistors (FETs) are commonly employed in electronic circuit applications. FETs may include a semiconductor substrate containing a source region and a drain region spaced apart by a channel region. A gate electrode may be formed above the channel region. In part to protect the gate electrode, insulating spacers and a hard cap may be formed on the side and top, respectively, of the gate electrode. The gate electrode may then be surrounded by a dielectric layer formed above the FET. By applying voltage to the gate electrode, the conductivity of the channel region may increase and allow current to flow from the source region to the drain region.

To allow current to flow between the source and drain region, electrical contacts may be formed on the source region and the drain region. The contacts may be formed by etching contact holes in the dielectric layer. As transistor structures continue to become smaller in size, it becomes increasingly difficult to lithographically define the borders of the contact holes. As a result, techniques may be developed to use the insulating spacers and hard cap of the gate electrode to form borderless, self-aligned contacts. Borderless contacts may be formed so that there is no remaining material of the dielectric layer between the borderless contact and the spacers and hard cap of the FET. By using the spacers and hard cap to define the contact, it may be possible to maximize the interface between the contact and the source/drain region while also utilizing a less precise lithographic process.

However, the etching processes used to define the contact may result in damage to the spacers and hard cap. This damage may further result in damage to the gate electrode or shorting between the gate electrode and electrical contact. Therefore, a process for forming self-aligned contacts that maintains the integrity of the gate spacers and gate hard cap may be desirable.

BRIEF SUMMARY

The present invention relates to methods of forming borderless contacts for semiconductor transistors. According to at least one exemplary embodiment, methods may include first providing a transistor structure including a gate, a spacer on a sidewall of the gate, a hard cap above the gate, a source/drain region adjacent to the spacer, and an interlevel dielectric layer around the gate. A contact hole may then be formed above the source/drain region that exposes a portion of the hard cap and a portion of the spacer. The exposed portions of the spacer and the hard cap may be collectively large enough to support formation of a protective layer. After formation of a protective layer on the exposed portions of the spacer and the hard cap, the contact hole may be deepened by etching the interlevel dielectric layer to expose a portion of the source/drain region. While deepening the contact hole, the spacer and the hard cap may be protected by the protective layer. After the contact hole exposes a portion of the source/drain region, the protective layer may be removed and a metal contact may be formed in the contact hole.

Elements of the figures are not necessarily to scale and are not intended to portray specific parameters of the invention. For clarity and ease of illustration, dimensions of elements may be exaggerated. The detailed description should be consulted for accurate dimensions. The drawings are intended to depict only typical embodiments of the invention, and therefore should not be considered as limiting the scope of the invention. In the drawings, like numbering represents like elements.

DETAILED DESCRIPTION

Exemplary embodiments now will be described more fully herein with reference to the accompanying drawings, in which exemplary embodiments are shown. This disclosure may, however, be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

Figure 1A:
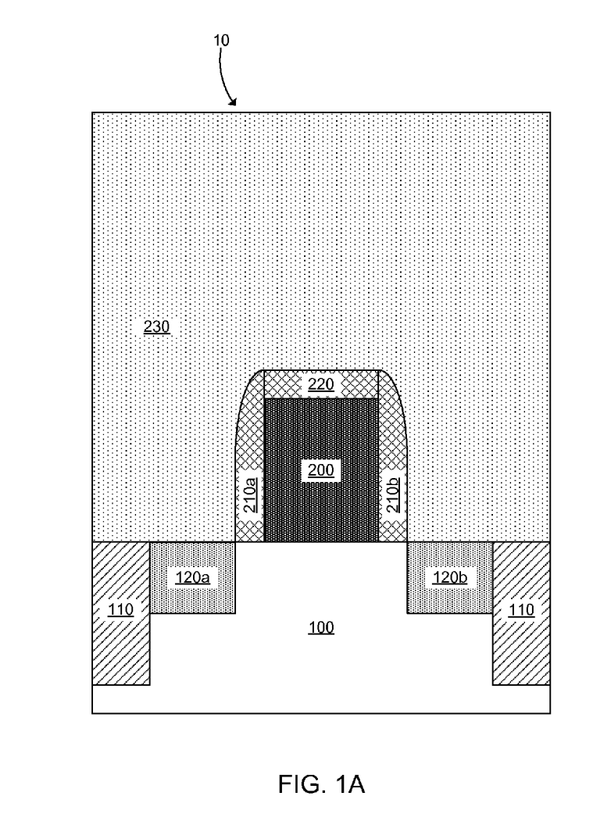
FIG. 1A depicts forming a planar field effect transistor (FET) using a gate-first process, according to an embodiment of the present invention.
Figure 1B:
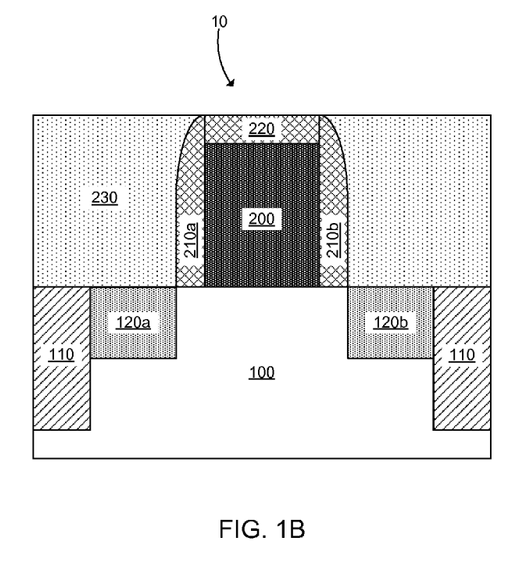
FIG. 1B depicts forming a planar field effect transistor (FET) using a gate-last process, according to an embodiment of the present invention

Referring to FIGS. 1A-1B, a transistor structure 10 may be formed by any methods known in the art, including a gate-first process, as depicted in FIG. 1A, and a gate-last process depicted in FIG. 1B. The transistor structure 10 may include a semiconductor substrate 100, a gate 200 formed on the semiconductor substrate 100, spacers 210a and 210b formed on the left and right sidewalls of the gate 200, respectively, and source/drain regions 120a and 120b formed in the semiconductor substrate 100 to the left and right of the gate 200, respectively.

Referring to both the gate-first process of FIG. 1A and the gate-last process of FIG. 1B, the substrate 100 may be made of any semiconductor material including, but not limited to: silicon, germanium, silicon-germanium alloy, silicon carbide, silicon-germanium carbide alloy, and compound (e.g. III-V and II-VI) semiconductor materials. Non-limiting examples of compound semiconductor materials include gallium arsenide, indium arsenide, and indium phosphide. Typically the substrate 100 may be about, but is not limited to, several hundred microns thick. For example, the substrate 100 may include a thickness ranging from 0.5 mm to about 1.5 mm. The substrate 100 may further include isolation regions 110 to isolate the transistor structure 10 from adjacent structures (not shown). The isolation regions 110 may be formed by any known method in the art, including, for example, etching into the substrate 100 to form trenches, and then filling the trenches with an insulating material, such as silicon oxide. Other embodiments may include other means of isolating structures formed on the substrate 100, or may have isolation around only some of, or none of, the structures. For example, in some embodiments, the substrate 100 may be a semiconductor-on-insulator (SOI) substrate (not shown), including a handle substrate, a buried insulator layer, and a top insulator layer.

In the gate-first process depicted in FIG. 1A the gate 200 may include a gate dielectric layer and a gate electrode. More specifically, the gate 200 may include a high-k layer, one or more work function metal layers, and a gate electrode made of a metal or a semiconductor material. The gate 200 may have a vertical height of approximately 30 nm to approximately 100 nm and a horizontal width of approximately 15 nm to approximately 100 nm, although greater or lesser heights and widths are also conceived.

The hard cap 220 may be formed above the gate 200 to protect the gate 200 during later fabrication processes. The hard cap 220 may be made of materials including, but not limited to, silicon nitride, silicon oxide, silicon carbide and may have a thickness of approximately 5 nm to approximately 100 nm, more preferably approximately 20 to approximately 50 nm. In one embodiment, the hard cap 220 may have a thickness of approximately 30 nm. After formation of the gate 200, the spacers 210 may be formed on the sidewalls of the gate 200. The spacers 210a and 210b may be formed, for example, by depositing an insulating layer over the gate 200 using known deposition techniques including, for example, chemical vapor deposition (CVD) and atomic layer deposition (ALD) and then removing excess material using an anisotropic etching process, such as reactive ion etching (RIE) or plasma etching (not shown). Due to the etching process, the spacers 210a and 210b may have a curved top surface in the region of the top edges of the gate 200 sidewalls. The spacers 210a and 210b may be made of materials including, but not limited to, silicon nitride, silicon oxide, silicon carbide and may have a horizontal thickness of approximately 2 nm to approximately 100 nm, preferably approximately 2 nm to approximately 50 nm.

Source/drain regions 120a and 120b may be single-crystal semiconductor regions formed in the substrate 100 by any known methods in the art, including doping the substrate 100 via ion implantation. In other embodiments, the source/drain regions 120 may be formed by etching recess regions in the substrate 100 and then filling the recess regions with semiconductor material, such as silicon, silicon-germanium, or silicon-carbon, using known deposition or growth methods (not shown). In some embodiments, raised source/drain techniques may be incorporated such that the source/drain regions 120a and 120b may extend above the top surface of the substrate 100 (not shown). The source/drain regions 120a and 120b may further include silicide layers on their top surfaces (not shown). The silicide layers may be formed by depositing a metal layer on the top surfaces of the source/drain regions 120a and 120b, annealing the source/drain regions 120a and 120b to react the source/drain regions 120a and 120b with the metal layer, and then removing any unreacted portions of the metal layer.

An interlevel dielectric (ILD) layer 230 may be formed on the substrate 100 around the gate 200. The ILD layer 230 may be formed by depositing, using any known deposition technique, an insulating material, for example, silicon oxide, above the substrate 100 and encapsulating the gate 200. The process sequence of forming the gate 200, the spacer 210, the gate cap 220, the source/drain regions 120a and 120b may vary depending on manufacturing and process requirements.

In the gate last process depicted in FIG. 1B, a sacrificial gate (not shown) may be formed on the substrate 100, followed by forming spacers 210a and 210b, forming source/drain regions 120a and 120b in the substrate 100, and depositing the ILD layer 230 over the sacrificial gate, according to the processes described above in conjunction with FIG. 1A. The ILD layer 230 may then be planarized to expose the sacrificial gate. The sacrificial gate may then be removed to form a gate recess, and the gate 200 and the hard cap 220 may then be formed in the gate recess.

It will be understood that the transistor structure 10 is merely an exemplary structure, and that embodiments of the present invention may include a broad range of transistor structures. For example, transistor structure 10 as depicted in FIGS. 1A-1B is a planar field effect transistor (FET) device. However, embodiments of the invention may also include finFET structures. In finFET structures, the gate of the transistor structure may be formed over one or more semiconductor fins, where the portion of the fins covered by the gate serves as a channel region of the transistor structure and portions of the fins extending out from under the gate may serve as source and drain regions of the transistor structure. A person of ordinarily skill in the art will understand how to apply the processes described below in conjunction with FIGS. 2-8 to a finFET structure rather than a planar FET structure.

Figure 2:
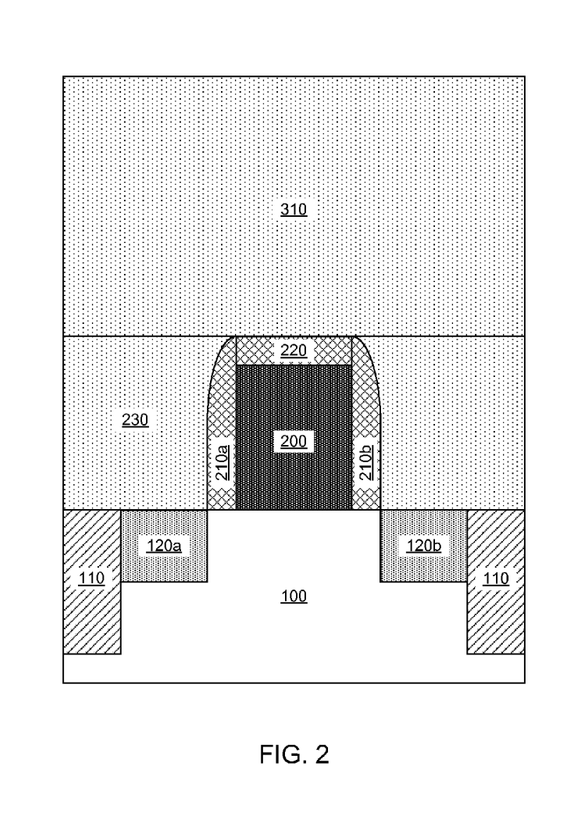
FIG. 2 depicts depositing an insulating layer above the FET of FIG. 1B, according to an embodiment of the present invention.

Referring to FIG. 2, an insulating layer 310 may be formed above the ILD layer 230 so that the total combined vertical thickness of the ILD layer 230 and the insulating layer 310 is approximately 50 nm to approximately 400 nm, measured from the top surface of the substrate 100. Where the ILD layer 230 is of sufficient thickness, as it may be in a gate-first process such as that depicted in FIG. 1A, formation of the insulating layer 310 may not be necessary. The insulating layer may be made of any of the same materials as the ILD layer 230 and formed by the same processes. In another embodiment, the ILD layer 230 and the insulating layer 310 may be made of different materials.

Figure 3:
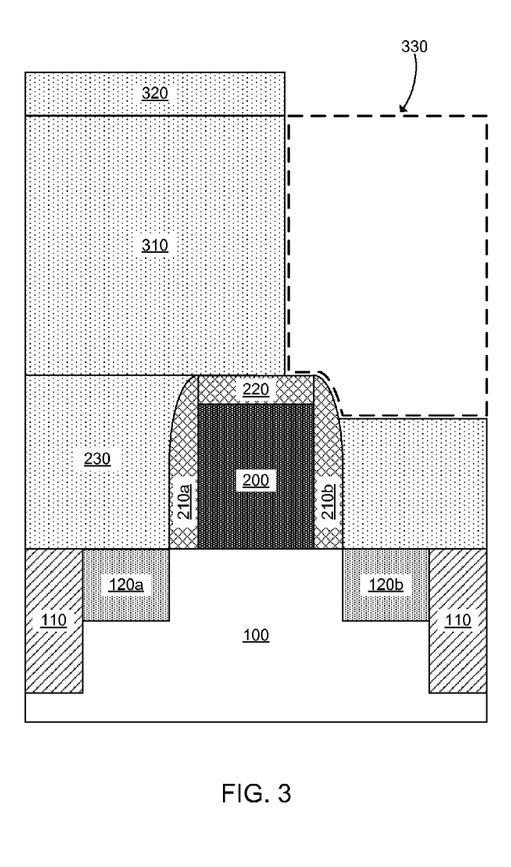
FIG. 3 depicts forming a contact hole that exposes a portion of a spacer and a portion of a hard cap of the FET, according to an embodiment of the present invention.

Referring to FIG. 3, a contact hole 330 may be formed using a first etching process to expose a portion of the spacer 210b and a portion of the hard cap 220. The first etching process may include depositing a photoresist layer 320 above the insulating layer 310, exposing and developing the photoresist to remove unwanted material, and then etching the insulating layer 310 and ILD layer 230 using the developed photoresist layer 320 as a mask. Following the etching process, photoresist layer 320 may be removed. The exposed portion of the hard cap 220 and the spacer 210b may be large enough to support formation of a protective layer as discussed below in conjunction with FIG. 4 without substantially damaging either the hard cap 220 or the spacer 210b. The exposed portion of the hard cap 220 may have a horizontal width of approximately 5 nm to approximately 10 nm. The exposed portion of the spacer 210b may have a vertical height of approximately 0 nm to approximately 30 nm. The first etching process may include depositing and developing a photoresist layer (not shown) above insulating layer 310, followed by an anisotropic etching process such as RIE or plasma etching, capable of selectively removing the material of the insulating layer 310 and the ILD layer 230 in the region not covered by the photoresist layer 330 without substantially removing material from spacer 210b and the hard cap 220. In embodiments where spacer 210b and the hard cap 220 are made of silicon nitride, the insulating layer 310 and the ILD layer 230 are made of silicon oxide and may be etched using any reactive ion etch (RIE) process which etches silicon oxide at a greater rate than silicon nitride.

Figure 4:
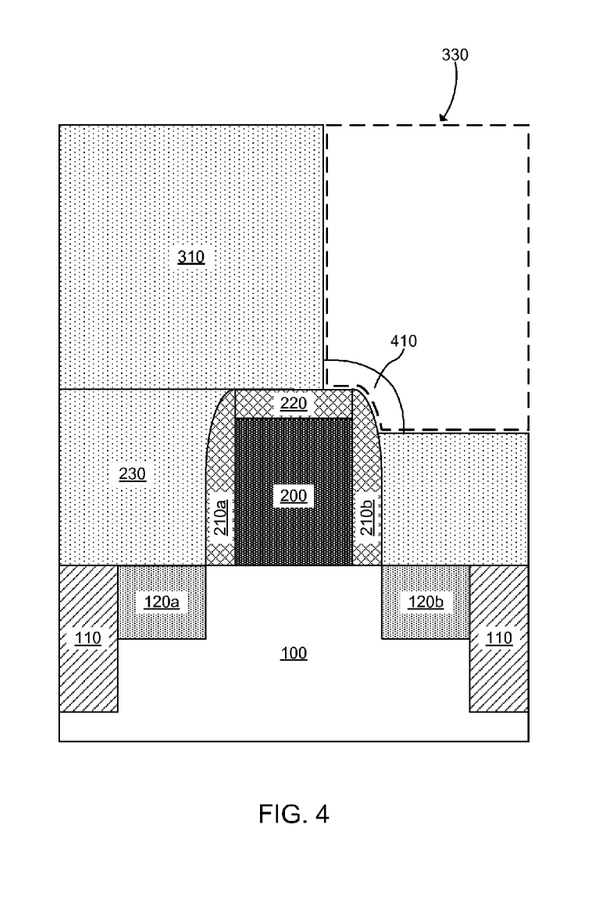
FIG. 4 depicts forming a protective layer on the exposed portion of the spacer and the exposed portion of the hard cap of the FET, according to an embodiment of the present invention.

Referring to FIG. 4, a protective layer 410 may be formed in the contact hole 330 to protect the exposed portions of the spacer 210b and the hard cap 220. The protective layer 410 may be made of amorphous silicon, amorphous germanium, or amorphous silicon-germanium and may have a thickness sufficient to protect the hard cap 220 and the spacer 210b. In one embodiment, the protective layer may have a thickness of approximately 5 nm to approximately 15 nm. In one embodiment, the protective layer 410 may have a thickness of approximately 10 nm. The protective layer 410 may be formed by selectively growing an amorphous silicon, an amorphous germanium, or an amorphous silicon-germanium layer on the exposed portions of spacer 210b and the hard cap 220 but not on the insulating layer 310 or the ILD layer 230. Selective growth of amorphous silicon, amorphous germanium, or amorphous silicon-germanium may be accomplished, for example, using a reduced pressure chemical vapor deposition (RPCVD) process. The RPCVD may occur at a pressure of approximately 1 Torr to approximately 200 Torr and utilize a precursor to encourage growth in the desired area (i.e., on spacer 210b and the hard cap 220), a etchant to discourage growth in undesired areas (i.e., not on the insulating layer 310 and the ILD layer 230), and a carrier gas to transport the precursor and the etchant. Precursors may include, but are not limited to, silane ($SiH_4$), dichlorosilane ($SiH_2Cl_2$), tetrachlorosilane ($SiCl_4$), dislane ($Si_2H_6$), trisilane ($Si_3H_8$), germylsilanes ($SiGeH_6$), germane ($GeH_4$), dichlorogermane ($GeH_2Cl_2$), trichlorogermane ($GeHCl_3$), tetrachlorogermane ($GeCl_4$), and silylgermanes. Etchants may include, but are not limited to, dichlorosilane ($SiH_2Cl_2$), hydrochloride (HCL), and chlorine ($Cl_2$). Carrier gases may include, but are not limited to, hydrogen ($H_2$), Argon (Ar), and nitrogen ($N_2$). To achieve the desired level of selectivity, the ratio of precursors, etchants, and carrier gases may be varied. For example, where spacer 210b and the hard cap 220 are made of silicon nitride and the insulating layer 310 and the ILD layer 230 are made of silicon oxide, amorphous silicon-germanium may selectively grown on spacer 210b and the hard cap 220 using a mixture of $SiH_4$, $GeH_4$, HCl, and $H_2$ at a precursor-etchant-carrier ratio, based on volumetric flow rate, ranging from approximately 1:0.5:0.2:30 to approximately 1:0.7:0.2:30 with a flow rate of approximately 20 standard cubic centimeters per minute (sccm) to approximately 60 sccm. In one embodiment, the precursor-etchant-carrier ratio is preferably 1:0.5:0.5:30. By adjusting the temperature, pressure, flow rates, precursors, etchants, carriers, and time of exposure, a person of ordinary skill in the art may be able to form the protective layer 410 with any number of desired compositions and thicknesses.

Figure 5:
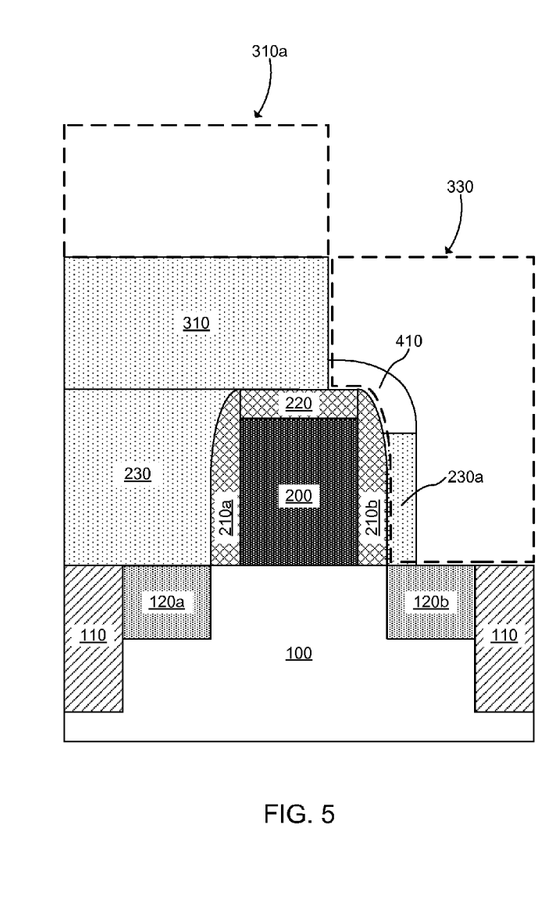
FIG. 5 depicts expanding the contact hole to expose a portion of a source/drain region of the FET, according to an embodiment of the present invention.

Referring to FIG. 5, the contact hole 330 may be deepened using a second etching process to expose at least a portion of the source/drain region 120b. The second etching process may be an anisotropic etching process such as, for example, RIE or plasma etching, capable of selectively removing material from ILD layer 230 without substantially removing material from the protective layer 410 or the source/drain region 120b. By forming protective layer 410 prior to the second etching process, spacer 210b and the hard cap 220 may be protected by the protective layer 410 during the second etching process. Without the protective layer 410, the second etching process may damage spacer 210b and the hard cap 220, increasing the likelihood of damage to the gate 200 and the likelihood of shorting between the gate 200 and the contact subsequently formed in contact hole 330.

In embodiments where the protective layer 410 is made of silicon and the ILD layer 230 is made of silicon oxide, the second etching process may etch the insulating layer 310 and the ILD layer 230 using any suitable reactive ion etch (RIE) process that etches silicon oxide at a greater rate than Si. In some embodiments, the second etching process may also remove a portion 310a of the insulating layer 310. In other embodiments, a mask layer (not shown) may be deposited above the insulating layer 310 to prevent the insulating layer 310 from being etched. Because the protective layer 410 may overhang spacer 210b, source/drain region 120b may still be covered by a portion 230a of the ILD layer 230.

Figure 6:
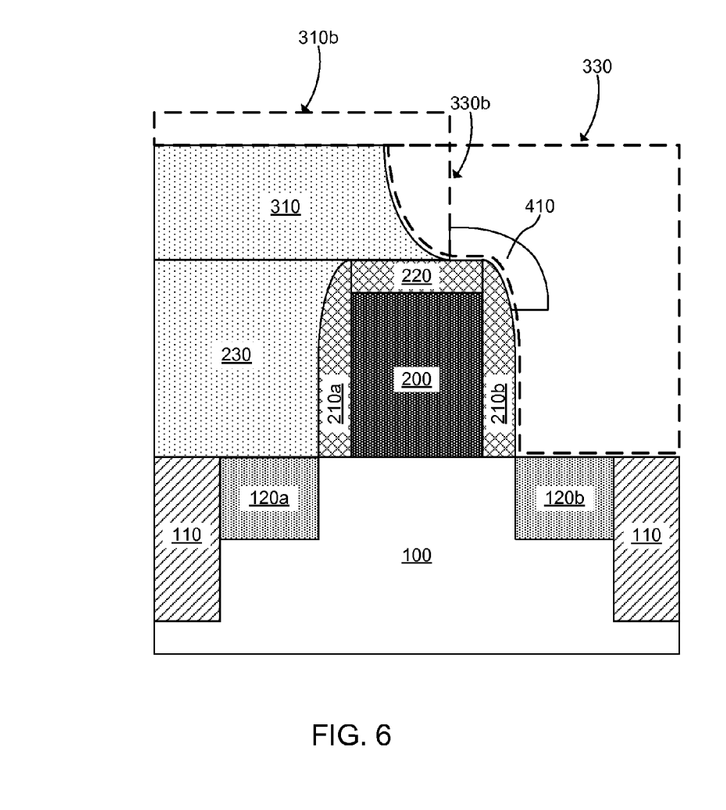
FIG. 6 depicts removing any remaining material from the contact hole, according to an embodiment of the present invention.

Referring to FIG. 6, the portion 230a (FIG. 5) of ILD layer 230 may be removed to expose a greater portion of sourced/drain region 120b. Because the portion 230a covers a portion of source/drain region 120b, removing portion 230a may increase device performance by increasing the total contact area between the source/drain region 120b and the contact subsequently formed in contact hole 330. The portion 230a may be removed using an isotropic etching process capable of removing the material of ILD layer 230 without substantially removing the material of spacer 210b or source/drain region 120b. In embodiments where spacer 210b is made of silicon nitride and the ILD layer 230 is made of silicon oxide, the portion 230a may be removed using a wet etch process containing hydrofluoric acid or a dry etch process such as chemical oxide removal (COR). In some embodiments, the isotropic etching process may also remove material from insulating layer 310, resulting in both a thinner layer (i.e., portion 310b is removed) and an expanded contact hole 330 that includes curved region 330b.

Figure 7:
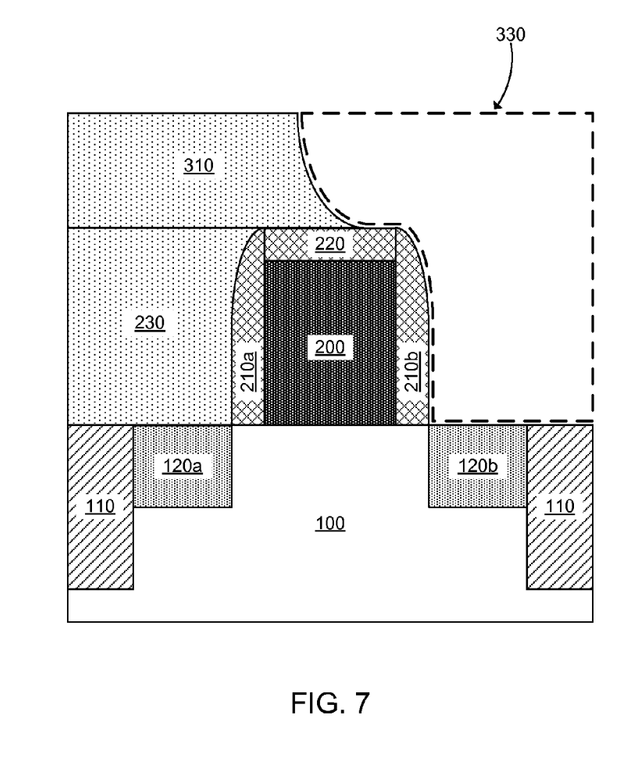
FIG. 7 depicts removing the protective layer from the spacer and the hard cap of the FET, according to an embodiment of the present invention.

Referring to FIG. 7, the protective layer 410 (FIG. 6) may be removed from spacer 210b and the hard cap 220. In embodiments where source/drain region 120b includes a top silicide layer and the protective layer 410 is made of silicon, the protective layer 410 may be removed by any etching process capable of selectively removing silicon without substantially removing silicide, such as an ammonia-based wet etch or a chemical downstream etch (CDE) dry etch. In embodiments where source/drain region 120b is made of single-crystal silicon and does not include a top silicide layer, and the protective layer 410 is made of amorphous silicon, the protective layer 410 may be selectively removed without damaging source/drain region 120b by using an etch process such as an ammonia-based wet etch.

Figure 8:
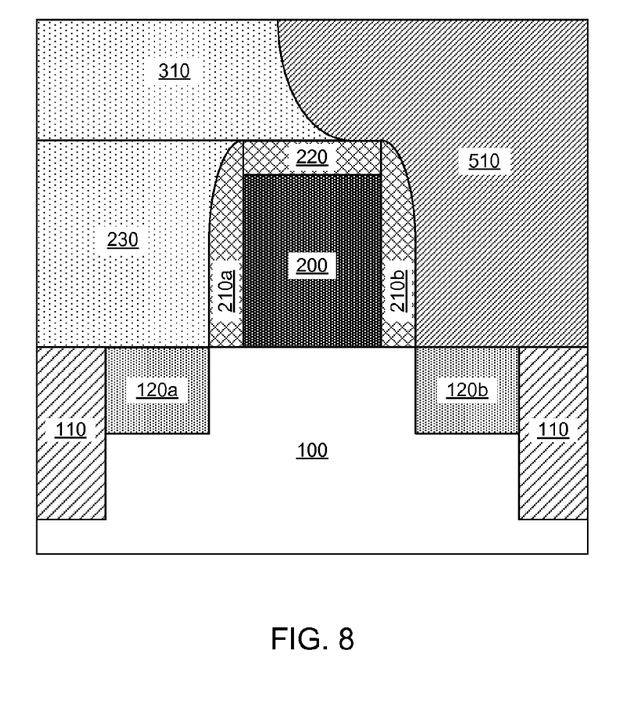
FIG. 8 depicts filling the contact hole with metal to form a contact to the source/drain region, according to an embodiment of the present invention.

Referring to FIG. 8, a contact 510 may be formed by filling contact hole 330 with a conductive liner (not shown) and a conductive fill. The conductive liner may be made of, for example, titanium, tantalum, nickel, platinum, palladium, erbium, or ytterbium and formed using known metal deposition techniques including, but not limited to, chemical vapor deposition (CVD), physical vapor deposition (PVD) and atomic layer deposition (ALD). The conductive fill may include, for example, tungsten, copper, aluminum, silver, gold, alloys thereof, and any suitable combination thereof, and may be deposited by any suitable technique, including but not limited to, for example, atomic layer deposition (ALD), molecular layer deposition (MLD), chemical vapor deposition (CVD), in-situ radical assisted deposition, metal-organic chemical vapor deposition (MOCVD), molecular beam epitaxy (MBE), physical vapor deposition (PVD), sputtering, plating, evaporation, ion beam deposition, electron beam deposition, laser assisted deposition, chemical solution deposition, or any combination thereof.

While the embodiments depicted in FIGS. 1-8 depict a contact formed only to source/drain region 120b, contacts may also be formed to source/drain region 120a and the gate 200 using the same method as that used to form contact 510. These contacts may be in the same plane as contact 510, or may be offset from contact 510.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein. It is therefore intended that the present invention not be limited to the exact forms and details described and illustrated but fall within the scope of the appended claims.

What is claimed is:

1. A method of forming a borderless contact, the method comprising:
    providing a transistor structure, wherein the transistor structure includes a gate, a spacer on a sidewall of the gate, a hard cap above the gate, a source/drain region adjacent to the spacer, and an interlevel dielectric layer around the gate;
    forming a contact hole above the source/drain region, wherein a portion of the hard cap and a portion of the spacer is exposed by the contact hole;
    forming a protective layer on the exposed portion of the hard cap and the exposed portion of the spacer;
    deepening the contact hole by etching the interlevel dielectric layer while the spacer and the hard cap are protected by the protective layer, so that at least a portion of the source/drain region is exposed by the deepening of the contact hole;
    removing the protective layer; and
    forming a metal contact in the contact hole.

2. The method of claim 1, wherein forming the contact hole comprises etching the interlevel dielectric layer in a region above the source/drain region.

3. The method of claim 1, wherein the exposed portion of the hard cap and the exposed portion of the spacer are collectively large enough to support formation of the protective layer without causing damage to the hard cap or the spacer.

4. The method of claim 3, wherein the exposed portion of the hard cap has a horizontal width of approximately 5 nm to approximately 10 nm.

5. The method of claim 3, wherein the exposed portion of the spacer has a vertical height of approximately 0 nm to approximately 30 nm.

6. The method of claim 1, wherein forming the protective layer comprises forming a layer of sufficient thickness to protect the spacer and the hard cap while the contact hole is deepened to expose at least a portion of the source/drain region.

7. The method of claim 6, wherein the protective layer has a thickness of approximately 5 nm to approximately 15 nm.

8. The method of claim 7, wherein the protective layer has a thickness of approximately 10 nm.

9. The method of claim 1, wherein forming the protective layer comprises selectively growing a layer of amorphous silicon, amorphous germanium, or amorphous silicon-germanium on the exposed portion of the hard cap and the exposed portion of the spacer.

10. The method of claim 1, wherein forming the protective layer comprises selectively growing a layer of amorphous silicon, amorphous germanium, or amorphous silicon-germanium using a low-pressure chemical vapor deposition process.

11. The method of claim 1, further comprising removing a portion of the interlevel dielectric layer shadowed by the protective layer using an isotropic etching process prior to removing the protective layer.

12. The method of claim 11, wherein the isotropic etching process comprises a hydrofluoric acid-based wet etch process or a chemical oxide removal dry etch process.

13. The method of claim 1, wherein the protective layer is removed using an ammonia-based wet etch process or a chemical downstream dry etch process.

14. The method of claim 1, wherein forming the protective layer comprises selectively growing a layer of amorphous silicon, amorphous germanium, or amorphous silicon-germanium on the exposed portion of the hard cap and the exposed portion of the spacer using a low-pressure chemical vapor deposition process.

15. The method of claim 1, further comprising removing a portion of the interlevel dielectric layer shadowed by the protective layer using a isotropic etching process prior to removing the protective layer.

16. A method of forming a semiconductor structure, the method comprising:
    forming a contact hole in an interlevel dielectric layer above a source/drain region of a transistor, wherein the contact hole exposes a portion of a hard cap of the transistor and a portion of a spacer of the transistor;
    growing a protective layer on the exposed portion of the hard cap and the exposed portion of the spacer;
    etching the interlevel dielectric layer in the contact hole to expose a portion of the source/drain region, wherein the spacer and the hard cap are protected by the protective layer while etching the interlevel dielectric layer;
    removing the protective layer; and
    depositing a conductive fill in the contact hole.

17. The method of claim 16, wherein forming the contact hole in the interlevel dielectric layer further comprises etching one or more insulating layers above the interlevel dielectric layer.

18. The method of claim 16, wherein the exposed portion of the hard cap and the exposed portion of the spacer are collectively large enough to support formation of the protective layer without causing damage to the hard cap or the spacer.

19. The method of claim 16, wherein forming the protective layer comprises forming a layer of sufficient thickness to protect the spacer and the hard cap while etching the interlevel dielectric layer in the contact hole.

20. A method of forming a semiconductor structure, the method comprising:
    etching an interlevel dielectric layer above a source/drain region of a transistor to expose a portion of a hard cap of the transistor and a portion of a spacer of the transistor;
    growing an amorphous protective layer on the exposed portion of the hard cap and the exposed portion of the spacer, wherein the amorphous protective layer comprises silicon, silicon-germanium, or carbon-doped silicon;
    etching the interlevel dielectric layer in adjacent to the protective layer to expose a portion of the source/drain region, wherein the transistor is protected by the protective layer while etching the interlevel dielectric layer;
etching the protective layer to expose the hard cap and the spacer; and
forming a metal contact to the source/drain region adjacent to the hard cap and the spacer.

21. The method of claim 20, wherein the exposed portion of the hard cap and the exposed portion of the spacer are collectively large enough to support formation of the protective layer without causing damage to the hard cap or the spacer.

22. The method of claim 21, wherein the exposed portion of the hard cap has a horizontal width of approximately 5 nm to approximately 10 nm.

23. The method of claim 21, wherein the exposed portion of the spacer has a vertical height of approximately 0 nm to approximately 30 nm.

24. The method of claim 20, wherein the protective layer has sufficient thickness to protect the spacer and the hard cap while etching the interlevel dielectric layer in the contact hole.

25. The method of claim 24, wherein the protective layer has a thickness of approximately 5 nm to approximately 15 nm.

* * * * *